US012768044B2

(12) United States Patent
Baluja et al.

(10) Patent No.: US 12,768,044 B2
(45) Date of Patent: Oct. 20, 2026

(54) PRECURSOR DELIVERY SYSTEM

(71) Applicant: Applied Materials, Inc., Santa Clara, CA (US)

(72) Inventors: Sanjeev Baluja, Campbell, CA (US); Kevin Griffin, Livermore, CA (US); Yi Xu, San Jose, CA (US); Yu Lei, Belmont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 22 days.

(21) Appl. No.: 18/907,826

(22) Filed: Oct. 7, 2024

(65) Prior Publication Data

US 2026/0098340 A1 Apr. 9, 2026

(51) Int. Cl.
*C23C 16/455* (2006.01)
*C23C 16/14* (2006.01)
*C23C 16/52* (2006.01)

(52) U.S. Cl.
CPC ........ *C23C 16/45561* (2013.01); *C23C 16/14* (2013.01); *C23C 16/52* (2013.01)

(58) Field of Classification Search
CPC .... C23C 16/45561; C23C 16/14; C23C 16/52
See application file for complete search history.

(56) References Cited

U.S. PATENT DOCUMENTS 4,522,149 A 6/1985 Garbis et al.
6,984,591 B1 1/2006 Buchanan et al.
11,169,547 B2 11/2021 Rice et al.
11,560,624 B2 1/2023 Aubuchon
2004/0124131 A1* 7/2004 Aitchison .............. B01D 45/06 210/252
2005/0095859 A1* 5/2005 Chen ....................... C23C 16/52 438/689

(Continued)

FOREIGN PATENT DOCUMENTS

JP H11117070 A 4/1999
JP 2017179397 A 10/2017

(Continued)

OTHER PUBLICATIONS

Sperling, Brent A., et al., "Experiment-based modelling of a vapor draw ampoule used for low-volatility precursors". J Vac Sci Technol B Nanotechnol Microelectron. 2019 ; 37(6), pp. 1-19.*

(Continued)

*Primary Examiner* — Bret P Chen
(74) *Attorney, Agent, or Firm* — Servilla Whitney LLC

(57) ABSTRACT

Precursor delivery systems that can achieve increased dose profile control compared to current precursor delivery systems are described. Processing methods that include using the precursor delivery system to deposit a film are also described. The precursor delivery system comprises a first precursor outlet line and a second precursor outlet line, each of the first precursor outlet line and the second precursor outlet line configured to allow the precursor to be delivered from a pressure-controlled precursor reservoir to a processing chamber, wherein the first precursor outlet line is configured to deliver the precursor at a first flow rate and the (Continued)

second precursor outlet line is configured to deliver the precursor at a second flow rate.

19 Claims, 2 Drawing Sheets

(56) References Cited

U.S. PATENT DOCUMENTS

| | | | |
|---|---|---|---|
| 2005/0166847 A1 | 8/2005 | Derderian | |
| 2008/0268143 A1 | 10/2008 | Vahlas et al. | |
| 2009/0162551 A1* | 6/2009 | Zilbauer | C23C 16/405 118/724 |
| 2009/0186479 A1 | 7/2009 | Okabe et al. | |
| 2010/0116208 A1* | 5/2010 | Sangam | C23C 16/4485 118/723 R |
| 2010/0285206 A1 | 11/2010 | Woelk et al. | |
| 2011/0311726 A1 | 12/2011 | Liu et al. | |
| 2013/0203267 A1* | 8/2013 | Pomarede | C23C 16/4482 438/778 |
| 2014/0308445 A1 | 10/2014 | Na et al. | |
| 2017/0159175 A1 | 6/2017 | Yagi et al. | |
| 2017/0335450 A1* | 11/2017 | Collins | C23C 16/4481 |
| 2018/0023195 A1* | 1/2018 | Muneshwar | C23C 16/45536 118/724 |
| 2018/0251893 A1 | 9/2018 | Hohn et al. | |
| 2019/0119813 A1* | 4/2019 | Khan | C23C 16/45557 |
| 2020/0056288 A1* | 2/2020 | Jeon | C23C 16/45544 |
| 2020/0071827 A1* | 3/2020 | AuBuchon | C23C 16/4481 |
| 2021/0262092 A1 | 8/2021 | Rasheed et al. | |
| 2021/0404058 A1* | 12/2021 | Maldonado-Garcia | C23C 16/45553 |
| 2022/0025517 A1 | 1/2022 | Hsieh | |
| 2022/0267898 A1 | 8/2022 | Salinas et al. | |

FOREIGN PATENT DOCUMENTS

| | | | | |
|---|---|---|---|---|
| KR | 20160134544 | A | 11/2016 | |
| KR | 20190115239 | A | 10/2019 | |
| WO | 2009015271 | A1 | 1/2009 | |
| WO | 2024050249 | A1 | 3/2024 | |
| WO | 2024129260 | A1 | 6/2024 | |
| WO | WO 2024/205980 | * | 10/2024 | C23C 14/35 |

OTHER PUBLICATIONS

Maslar, James E., et al., "Apparatus for Characterizing Gas-Phase Chemical Precursor Delivery for Thin Film Deposition Processes". Journal of Research of the National Institute of Standards and Technology, vol. 124, Article No. 124005 (2019), pp. 1-15.*

PCT International Search Report and Written Opinion in PCT/US2019/048992 dated Dec. 4, 2019, 12 pages.

PCT International Search Report and Written Opinion in PCT/US2024/012318 dated May 20, 2024, 12 pages.

PCT Written Opinion and International Search Report for PCT/US2025/049558, dated Feb. 9, 2026, 10 pages.

* cited by examiner

PRECURSOR DELIVERY SYSTEM

TECHNICAL FIELD

Embodiments of the present disclosure pertain to the field of semiconductor device manufacturing processes and apparatuses that are used in semiconductor device manufacturing processes. More particularly, embodiments of the present disclosure are directed to precursor delivery systems.

BACKGROUND

Several deposition techniques are used during semiconductor manufacturing including atomic layer deposition (ALD) and chemical vapor deposition (CVD). In both of these types of deposition techniques, a precursor and/or reactive gas may be co-flowed with a carrier gas or inert gas. In many processes, the co-flowed precursor/carrier gas is pulsed into an inert gas flow to create a pulsed process sequence.

For ALD or other cyclic processes, film deposition is achieved by separating reactable chemistries in the gas phase. Thus, purging with an inert gas is required between the reactive chemical doses. Typical ALD processes include repeated cycles of exposing a substrate to a first precursor/reactive gas, exposing the substrate to an inert gas, exposing the substrate to a second precursor/reactive gas, and exposing the substrate to the inert gas to form a film having a predetermined thickness. A carrier gas is typically used with liquid or solid precursors to increase precursor flux. This precursor gas delivery is pulsed using fast switching valves or ALD valves. However, for all instances, the purge gas flows continuously.

During the pulse steps, it remains a challenge to maintain control of the precursor dose profile. Increased dose profile control over the selected precursor provides numerous advantages, including, but not limited to, controlling overshoot amplitude, overshoot width, and decay time to steady state flow.

Accordingly, there is a need for precursor delivery systems that can achieve increased dose profile control compared to current precursor delivery systems.

SUMMARY

One or more embodiments of the disclosure are directed to a precursor delivery system. The precursor delivery system comprises: an ampoule configured to contain a precursor; a pressure-controlled precursor reservoir including a precursor inlet line connected to the ampoule and a plurality of outlet lines connected to the pressure-controlled precursor reservoir; a first inert gas reservoir including a first inert gas inlet line connected to a first inert gas source and a first inert gas outlet line connected to the first inert gas reservoir; a reactive gas reservoir including a reactive gas inlet line connected to a reactive gas source and a reactive gas outlet line connected to the reactive gas reservoir, the reactive gas inlet line configured to allow a reactive gas to be delivered from the reactive gas source to the reactive gas reservoir; and a second inert gas reservoir including a second inert gas inlet line connected to a second inert gas source and a second inert gas outlet line connected to the second inert gas reservoir. The plurality of outlet lines includes a first precursor outlet line and a second precursor outlet line, each of the first precursor outlet line and the second precursor outlet line configured to allow the precursor to be delivered from the pressure-controlled precursor reservoir to a processing chamber. The first precursor outlet line is configured to deliver the precursor at a first flow rate and the second precursor outlet line is configured to deliver the precursor at a second flow rate.

Additional embodiments of the disclosure are directed to a processing method. In one or more embodiments, the processing method comprises exposing a substrate in a processing chamber to a metallic precursor and a reactive gas to deposit a metal film on the substrate. The precursor and the reactive gas are each independently delivered to the substrate from the precursor delivery system according to one or more embodiments.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments described herein are illustrated by way of example and not limitation in the Figures.

DETAILED DESCRIPTION

Figure 1:
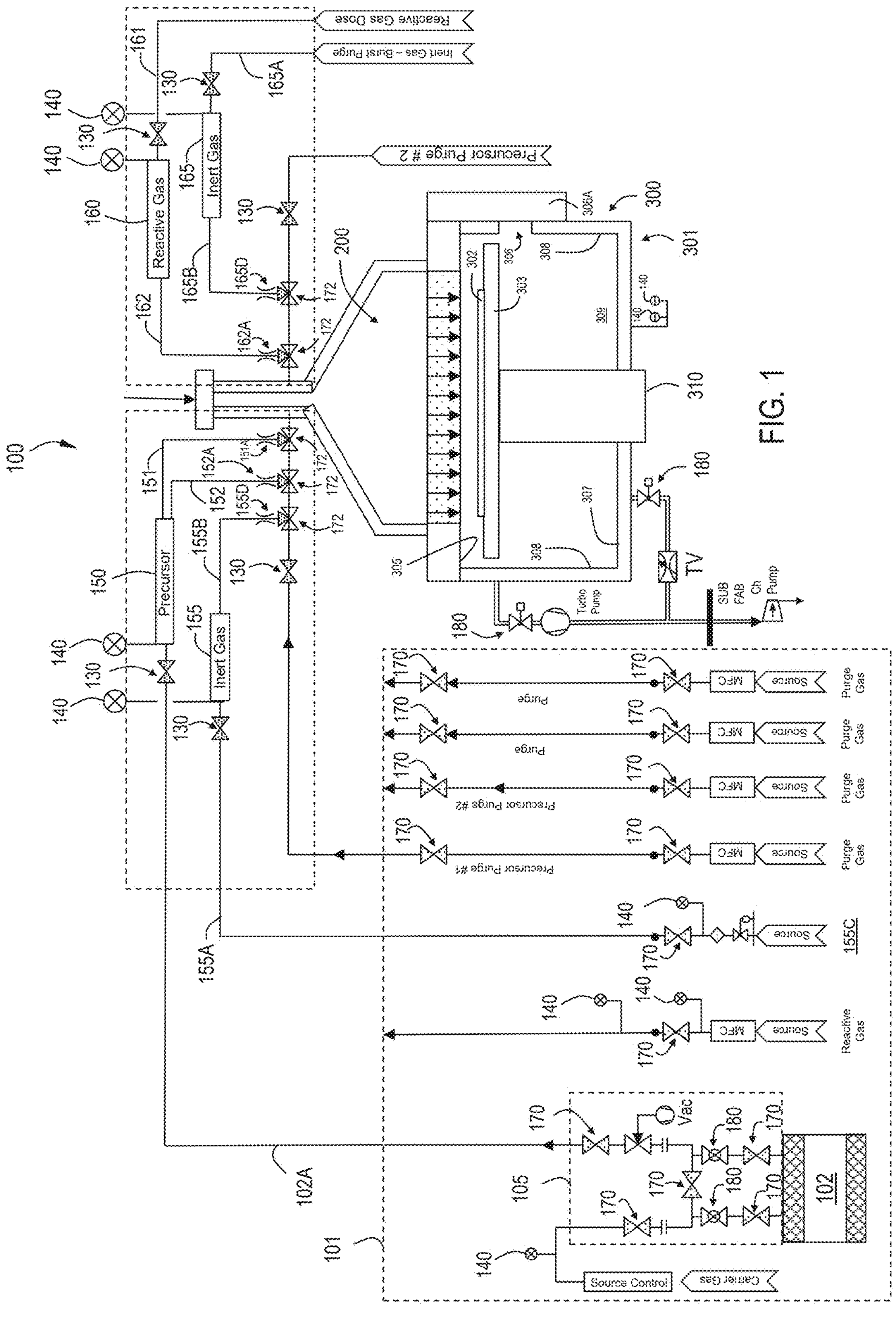
FIG. 1 illustrates a schematic representation of a precursor delivery system according to one or more embodiments of the present disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term “about” as used herein means approximately or nearly and in the context of a numerical value or range set forth means a variation of ±15% or less, of the numerical value. For example, a value differing by ±14%, ±10%, ±5%, ±2%, ±1%, ±0.5%, or ±0.1% would satisfy the definition of “about.”

Spatially relative terms, such as “beneath,” “below,” “lower,” “above,” “upper” and the like, may be used herein for ease of description to describe one element or feature’s relationship to another element(s) or feature(s) as illustrated in the Figures. It will be understood that the spatially relative terms are intended to encompass different orientations of a structure in use or operation in addition to the orientation depicted in the Figures. For example, if the structure in the Figures is turned over, elements described as “below” or “beneath” other elements or features would then be oriented “above” the other elements or features. Thus, the exemplary term “below” may encompass both an orientation of above and below. The structure may be otherwise oriented (rotated 90 degrees or at other orientations) and the spatially relative descriptors used herein interpreted accordingly.

The use of the terms "a" and "an" and "the" and similar referents in the context of describing the elements and features discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the elements and features and does not pose a limitation on the scope unless otherwise claimed. No language in the specification should be construed as indicating any non-claimed element as essential to the practice of the disclosed materials and methods.

Reference throughout this specification to "one embodiment," "some embodiments," "certain embodiments," "one or more embodiments," or "an embodiment" means that a particular feature, structure, material, or characteristic described in connection with the embodiment is included in at least one embodiment of the disclosure. Thus, the appearances of the phrases such as "in one embodiment," "in some embodiments," "in certain embodiments," "in one or more embodiments," or "in an embodiment" in various places throughout this specification are not necessarily referring to the same embodiment of the disclosure. Furthermore, the particular features, structures, materials, or characteristics may be combined in any suitable manner in one or more embodiments.

As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon (including doped silicon or undoped silicon), silicon oxide, strained silicon, silicon on insulator (SOI), carbon doped silicon oxides, amorphous silicon, germanium, gallium arsenide, and any other materials such as metals, metal nitrides, metal alloys, and other conductive materials, depending on the application. Substrates include, without limitation, semiconductor substrates.

Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The substrate may have one or more features formed therein, one or more layers formed thereon, or combinations thereof. The shape of the feature can be any suitable shape including, but not limited to, trenches, holes and vias (circular or polygonal). As used in this regard, the term "feature" refers to any intentional surface irregularity. Suitable examples of features include but are not limited to trenches, which have a top, two sidewalls comprising, for example, a dielectric material, and a bottom extending into the substrate, the bottom comprising, for example, a metallic material, or vias which have one or more sidewall extending into the substrate to a bottom, and slot vias.

The features described herein can extend vertically into the substrate and/or laterally within the substrate. Unless specifically indicated otherwise, the features described herein are not limited to either of a vertically extending feature or a laterally extending feature. In one or more embodiments, the substrate comprises at least one vertically extending feature. In one or more embodiments, the substrate comprises at least one laterally extending feature. In one or more embodiments, the substrate comprises at least one vertically extending feature and at least one laterally extending feature.

The features described herein can have any suitable aspect ratio (ratio of the depth of the feature to the width of the feature). In one or more embodiments, the aspect ratio of the features described herein is greater than or equal to about 1:1, 2:1, 5:1, 10:1, 15:1, 20:1, 25:1, 30:1, 35:1, 40:1, 50:1, 60:1, 70:1, 80:1, 90:1, 100:1, 125:1, or 150:1. In one or more embodiments, the aspect ratio of the features described herein is in a range of from 1:1 to 150:1.

The term "on" indicates that there is direct contact between elements. The term "directly on" indicates that there is direct contact between elements with no intervening elements.

As used herein, the term "in situ" refers to processes that are all performed in the same processing chamber or within different processing chambers that are connected as part of an integrated processing system, such that each of the processes are performed without an intervening vacuum break. As used herein, the term "ex situ" refers to processes that are performed in at least two different processing chambers such that one or more of the processes are performed with an intervening vacuum break. In some embodiments, processes are performed without breaking vacuum or without exposure to ambient air.

As used in this specification and the appended claims, the terms "precursor," "reactant," "reactive gas," "reactive species," and the like are used interchangeably to refer to any gaseous species or vapor species that can react with the substrate surface.

One or more of the layers deposited on the substrate or substrate surface are continuous. As used herein, the term "continuous" refers to a layer that covers an entire exposed surface without gaps or bare spots that reveal material underlying the deposited layer. A continuous layer may have gaps or bare spots with a surface area less than about 15% or less than about 10% of the total surface area of the layer.

As used herein, "chemical vapor deposition (CVD)" refers to a process in which a substrate surface is exposed to precursors and/or reactants simultaneously or substantially simultaneously. As used herein, "substantially simultaneously" refers to either co-flow or where there is overlap for a majority of exposures of the precursors and/or reactants.

As used herein, "pulsed CVD" refers to a process in which one of the precursor or the reactant is pulsed intermittently, and the other of the precursor of the reactant is flowed continuously. Plasma-enhanced chemical vapor deposition (PECVD) methods add a plasma exposure to traditional CVD methods. In some PECVD methods, an inert gas is provided as the plasma. Embodiments described herein in reference to a PECVD process can be carried out using any suitable deposition system.

"Atomic layer deposition" or "cyclical deposition" as used herein refers to the sequential exposure of two or more reactive species to deposit a layer of material on a substrate surface. The substrate, or portion of the substrate, is exposed separately to the two or more reactive species which are introduced into a reaction zone of a processing chamber. In a time-domain ALD process, exposure to each reactive species is separated by a time delay to allow each compound to adhere and/or react on the substrate surface and then be purged from the processing chamber. These reactive species are said to be exposed to the substrate sequentially.

As used herein, the terms "purge" or "purging" each independently include any suitable purge process that removes unreacted precursor/reactant, reaction products, and by-products from the process region (e.g., a processing chamber). The suitable purge process includes moving the substrate through a gas curtain to a portion or sector of the processing region that contains none or substantially none of the precursor/reactant. In one or more embodiments, purging the processing chamber comprises applying a vacuum. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, the first reactive species is purged from the processing chamber for a time duration in a range of from 0.1 seconds to 30 seconds, from 0.1 seconds to 10 seconds, from 0.1 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds before exposing the substrate to the second reactive species.

In a spatial ALD process, different portions of the substrate surface, or material on the substrate surface, are exposed simultaneously to the two or more reactive species so that any given point on the substrate is substantially not exposed to more than one reactive species simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas is introduced into the processing chamber to purge the reaction zone or otherwise remove any residual reactive species or reaction by-products from the reaction zone. Alternatively, the purge gas may flow continuously throughout the deposition process so that only the purge gas flows during the time delay between pulses of reactive species. The reactive species are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Plasma-enhanced atomic layer deposition (PEALD) methods add a plasma exposure to traditional ALD methods. In some PEALD methods, an inert gas is provided as the plasma. Embodiments described herein in reference to a PEALD process can be carried out using any suitable deposition system.

As used herein, the terms "thermal" or "thermal process (es)" each independently refer to a deposition technique that does not involve the use of plasma. As used herein, the term "plasma" refers to a composition have ionically charged species and uncharged neutral and radical species.

As used herein, as will be understood by the skilled artisan, a layer/film which is "conformal" or "conformally deposited" refers to a layer/film where the thickness is about the same throughout. A layer/film which is conformal varies in thickness by less than or equal to about 5%, 2%, 1% or 0.5%.

Embodiments of the present disclosure advantageously provide precursor delivery systems that are configured to provide a repeatable transient flow control profile for gas/vapor precursors. Some embodiments advantageously provide precursor delivery systems that are configured to provide a repeatable transient flow control profile for gas/vapor precursors by employing pressure-controlled reservoirs and fast switching valves. Some embodiments advantageously provide precursor delivery systems that are configured to provide transient flow profile control at less than or equal to 10 millisecond repeatability.

Some embodiments advantageously provide precursor delivery systems that are configured to control overshoot amplitude. Some embodiments advantageously provide precursor delivery systems that are configured to control overshoot width. Some embodiments advantageously provide precursor delivery systems that are configured to control decay time to steady state flow.

Some embodiments advantageously provide precursor delivery systems that can achieve increased dose profile control compared to current precursor delivery systems.

The embodiments of the disclosure are described by way of the Figures, which illustrate a precursor delivery system and a processing method that includes using the precursor delivery system. The skilled artisan will recognize that the disclosed processes are not limited to the illustrated applications.

FIG. 1 illustrates a schematic representation of a precursor delivery system 100 according to one or more embodiments of the present disclosure. In one or more embodiments, the precursor delivery system 100 is configured to deliver a precursor and a reactive gas to a processing chamber 300.

The precursor delivery system 100 includes a chemical delivery system 101. In one or more embodiments, the chemical delivery system 101 houses each of the delivery components comprised by the precursor delivery system 100. Each of the illustrated components of the chemical delivery system 101 are part of the precursor delivery system 100.

The precursor delivery system 100 comprises an ampoule 102 configured to contain a precursor; a pressure-controlled precursor reservoir 150 including a precursor inlet line 102A connected to the ampoule 102 and a plurality of outlet lines connected to the pressure-controlled precursor reservoir 150; a first inert gas reservoir 155 including a first inert gas inlet line 155A connected to a first inert gas source 155C and a first inert gas outlet line 155B connected to the first inert gas reservoir 155; a reactive gas reservoir 160 including a reactive gas inlet line 161 connected to a reactive gas source (represented by "Reactive Gas Dose") and a reactive gas outlet line 162 connected to the reactive gas reservoir 160, the reactive gas inlet line 161 configured to allow a reactive gas to be delivered from the reactive gas source (Reactive Gas Dose) to the reactive gas reservoir 160; and a second inert gas reservoir 165 including a second inert gas inlet line 165A connected to a second inert gas source (represented by "Inert Gas—Burst Purge") and a second inert gas outlet line 165B connected to the second inert gas reservoir 165.

As used herein, components that are "connected" allow a fluid to flow from one designated component to another designated component within an enclosed system. For example, where the pressure-controlled precursor reservoir 150 including a precursor inlet line 102A connected to the ampoule 102 and the precursor inlet line 102A is configured to allow the precursor to be delivered from the ampoule 102 to the pressure-controlled precursor reservoir 150, the fluid, i.e., the precursor, flows from one designated component (i.e., the ampoule 102) to another designated component (i.e., pressure-controlled precursor reservoir 150) within an enclosed system. In one or more embodiments, components that are "connected" are configured to prevent leakage.

The precursor delivery system 100 comprises the plurality of outlet lines connected to the pressure-controlled precursor reservoir 150. The plurality of outlet lines is configured to allow the precursor to be delivered from the pressure-controlled precursor reservoir 150 to a processing chamber 300.

The plurality of outlet lines can include any suitable number of outlet lines. In one or more embodiments, the plurality of outlet lines includes a first precursor outlet line 151 and a second precursor outlet line 152. In one or more embodiments, each of the first precursor outlet line 151 and the second precursor outlet line 152 are independently configured to allow the precursor to be delivered from the pressure-controlled precursor reservoir 150 to a processing chamber 300. In one or more embodiments, the precursor is delivered from the pressure-controlled precursor reservoir 150 through the first precursor outlet line 151 and the second precursor outlet line 152 to a gas distribution system 200, then from the gas distribution system 200 directly to the processing chamber 300.

The first precursor outlet line 151 is configured to deliver the precursor at a first flow rate and the second precursor outlet line 152 is configured to deliver the precursor at a second flow rate.

The precursor delivered from the ampoule 102 can be any suitable precursor. In one or more embodiments, the precursor comprises a metallic precursor. In one or more embodiments, the precursor comprises a metal halide precursor. In one or more embodiments, the precursor comprises molybdenum pentachloride ($MoCl_5$). In one or more embodiments, the precursor comprises tungsten hexachloride ($WCl_6$). It has been found that metallic precursors that contain fluorine and/or chlorine (such as molybdenum pentachloride ($MoCl_5$) or tungsten hexachloride ($WCl_6$)) have an etching regime as well as a deposition regime based on the relative concentrations and residence time. In some cases, it has been found that delivering metallic precursors that contain fluorine and/or chlorine (such as molybdenum pentachloride ($MoCl_5$) or tungsten hexachloride ($WCl_6$)) at a high concentration provides an etching regime, and delivering the same precursor at a low concentration provides a deposition regime.

The concentration domain, i.e., a high concentration or a low concentration depends on both the ampoule temperature and the inert gas flow rate. For example, for an ampoule temperature of ≥90° C. with an inert gas flow rate of ≥500 sccm, the metallic precursors that contain fluorine and/or chlorine (such as molybdenum pentachloride ($MoCl_5$) or tungsten hexachloride ($WCl_6$)) are delivered at a high concentration. For an ampoule temperature of ≤80° C. with an inert gas flow rate of ≤500 sccm, for example, the metallic precursors that contain fluorine and/or chlorine (such as molybdenum pentachloride ($MoCl_5$) or tungsten hexachloride ($WCl_6$)) are delivered at a low concentration. For the same ampoule heated at a specific temperature, an inert gas flow rate of >700 sccm leads to relatively high concentration while an inert gas flow rate of <350 sccm leads to relatively low concentration.

Advantageously, the precursor delivery system 100 can achieve increased dose profile control compared to current precursor delivery systems by delivering the precursor through the first precursor outlet line 151 and the second precursor outlet line 152 using a single ampoule.

In use, flow profile modulation and control can enable deposition selectivity improvement by enabling etch and deposition within each precursor pulse. In one or more embodiments, the first precursor outlet line 151 is configured to deliver the precursor at a first flow rate and the second precursor outlet line 152 is configured to deliver the precursor at a second flow rate. In one or more embodiments, the first flow rate and the second flow rate are different.

In one or more embodiments, the first flow rate is greater than the second flow rate. In specific embodiments where the first flow rate is greater than the second flow rate, the precursor (e.g., a metal halide precursor including tungsten hexachloride ($WCl_6$) or molybdenum pentachloride ($MoCl_5$)) is delivered at a high concentration, i.e., the first flow rate, thereby providing an etching regime, and the precursor (e.g., a metal halide precursor including tungsten hexachloride ($WCl_6$) or molybdenum pentachloride ($MoCl_5$)) is delivered at a low concentration, i.e., the second flow rate thereby providing a deposition regime.

It has been advantageously found that where the first flow rate is greater than the second flow rate, the precursor (e.g., a metal halide precursor including tungsten hexachloride ($WCl_6$) or molybdenum pentachloride ($MoCl_5$)) is delivered at a high concentration, i.e., the first flow rate, thereby providing an etching regime, and the precursor (e.g., a metal halide precursor including tungsten hexachloride ($WCl_6$) or molybdenum pentachloride ($MoCl_5$)) is delivered at a low concentration, i.e., the second flow rate thereby providing a deposition regime, produces improved deposition selectivity.

The chemical delivery system 101 includes a plurality of components configured to provide improved flow profile modulation and control. In the chemical delivery system 101, a hot can enclosure 105 is situated above the ampoule 102. The hot can enclosure 105 is configured to maintain a predetermined pressure and a predetermined temperature of the ampoule 102. The hot can enclosure 105 includes a plurality of valves, i.e., at least one valve 170 and at least one valve 180, and a vacuum pump (denoted as "Vac"). The at least one valve 170, which can be referred to herein as "valve 170", can be any suitable valve configured for controlling the distribution of the precursor from the ampoule 102 through the precursor inlet line 102A to the pressure-controlled precursor reservoir 150. In one or more embodiments, the valve 170 is a slow acting pneumatic valve. The at least one valve 180, which can be referred to herein as "valve 180", can be any suitable valve configured for controlling the distribution of the precursor from the ampoule 102 through the precursor inlet line 102A to the pressure-controlled precursor reservoir 150. In one or more embodiments, the valve 180 is a manual valve to be adjusted by a robot and/or a technician.

The first inert gas inlet line 155A is configured to allow a first inert gas to be delivered from the first inert gas source 155C to the first inert gas reservoir 155. The first inert gas outlet line 155B is configured to allow the first inert gas to be delivered from the first inert gas reservoir 155 to the processing chamber 300. The first inert gas can include any inert gas. In one or more embodiments, the first inert gas comprises one or more of helium (He), neon (Ne), argon (Ar), krypton (Kr), or xenon (Xe). In one or more embodiments, the first inert gas comprises argon (Ar).

The reactive gas inlet line 161 is configured to allow a reactive gas to be delivered from the reactive gas source ("Reactive Gas Dose") to the reactive gas reservoir 160. The reactive gas outlet line 162 is configured to allow the reactive gas to be delivered from the reactive gas reservoir 160 to the processing chamber 300. The reactive gas can be any suitable reactive gas that can react with the precursor. In one or more embodiments, the reactant comprises hydrogen ($H_2$).

The second inert gas inlet line 165A is configured to allow a second inert gas to be delivered from the second inert gas source ("Inert Gas—Burst Purge") to the second inert gas reservoir 165. The second inert gas outlet line 165B is configured to allow the second inert gas to be delivered from the second inert gas reservoir 165 to the processing chamber 300. The second inert gas can include any inert gas. In one or more embodiments, the second inert gas comprises one or more of helium (He), neon (Ne), argon (Ar), krypton (Kr), or xenon (Xe). In one or more embodiments, the first inert gas and the second inert gas are the same. In one or more embodiments, the second inert gas comprises argon (Ar).

In some embodiments, one or more of the precursor inlet line 102A, the first inert gas inlet line 155A, the reactive gas inlet line 161, and the second inert gas inlet line 165A independently comprises an inlet valve 130. In some embodiments, each of the precursor inlet line 102A, the first inert gas inlet line 155A, the reactive gas inlet line 161, and the second inert gas inlet line 165A independently comprises an inlet valve 130. As used herein, "inlet valve 130" is used to denote the same type of valve for one or more of the precursor inlet line 102A, the first inert gas inlet line 155A, the reactive gas inlet line 161, and the second inert gas inlet line 165A. For example, where each of the precursor inlet line 102A and the first inert gas inlet line 155A independently comprise an inlet valve, the reference numeral 130 is used to denote the inlet valve of the precursor inlet line 102A, and the inlet valve of the first inert gas inlet line 155A. In one or more embodiments, each inlet valve 130 is a fast switching valve configured to open and close within 50 milliseconds.

In some embodiments, one or more of the precursor inlet line 102A, the first inert gas inlet line 155A, the reactive gas inlet line 161, and the second inert gas inlet line 165A independently comprises a pressure gauge 140. In some embodiments, each of the precursor inlet line 102A, the first inert gas inlet line 155A, the reactive gas inlet line 161, and the second inert gas inlet line 165A independently comprises a pressure gauge 140. As used herein, "pressure gauge 140" is used to denote the same type of pressure gauge for one or more of the precursor inlet line 102A, the first inert gas inlet line 155A, the reactive gas inlet line 161, and the second inert gas inlet line 165A. For example, where each of the precursor inlet line 102A and the first inert gas inlet line 155A independently comprise a pressure gauge, the reference numeral 140 is used to denote the pressure gauge of the precursor inlet line 102A, and the pressure gauge of the first inert gas inlet line 155A.

The pressure gauge 140 can be any suitable pressure measurement device. In one or more embodiments, the pressure gauge 140 comprises a manometer. In one or more embodiments, the pressure gauge 140 comprises an XDCR pressure sensor/transducer.

In one or more embodiments, the inlet valve 130 of the precursor inlet line 102A is located upstream from the pressure-controlled precursor reservoir 150. In one or more embodiments, the precursor delivery system 100 comprises a pressure gauge 140 that is in fluid communication with the pressure-controlled precursor reservoir 150. In one or more embodiments, the pressure gauge 140 is located downstream from the inlet valve 130 on the precursor inlet line 102A. In one or more embodiments, the pressure-controlled precursor reservoir 150 is maintained at a pressure in a range of from 50 Torr to 900 Torr.

In one or more embodiments, the inlet valve 130 of the first inert gas inlet line 155A is located upstream from the first inert gas reservoir 155. In one or more embodiments, the precursor delivery system 100 comprises a pressure gauge 140 that is in fluid communication with the first inert gas reservoir 155. In one or more embodiments, the pressure gauge 140 is located downstream from the inlet valve 130 on the first inert gas reservoir 155. In one or more embodiments, the first inert gas reservoir 155 is maintained at a pressure in a range of from 50 Torr to 900 Torr.

In one or more embodiments, the inlet valve 130 of the reactive gas inlet line 161 is located upstream from the reactive gas reservoir 160. In one or more embodiments, the precursor delivery system 100 comprises a pressure gauge 140 that is in fluid communication with the reactive gas reservoir 160. In one or more embodiments, the pressure gauge 140 is located downstream from the inlet valve 130 on the reactive gas reservoir 160. In one or more embodiments, the reactive gas reservoir 160 is maintained at a pressure in a range of from 50 Torr to 900 Torr.

In one or more embodiments, the inlet valve 130 of the second inert gas inlet line 165A is located upstream from the second inert gas reservoir 165. In one or more embodiments, the precursor delivery system 100 comprises a pressure gauge 140 that is in fluid communication with the second inert gas reservoir 165. In one or more embodiments, the pressure gauge 140 is located downstream from the inlet valve 130 on the second inert gas reservoir 165. In one or more embodiments, the second inert gas reservoir 165 is maintained at a pressure in a range of from 50 Torr to 900 Torr.

In some embodiments, one or more of the first precursor outlet line 151, the second precursor outlet line 152, the first inert gas outlet line 155B, the reactive gas outlet line 162, and the second inert gas outlet line 165B independently comprises a three-way flow-through valve 172. In some embodiments, each of the first precursor outlet line 151, the second precursor outlet line 152, the first inert gas outlet line 155B, the reactive gas outlet line 162, and the second inert gas outlet line 165B independently comprises a three-way flow-through valve 172. As used herein, "three-way flow-through valve 172" is used to denote the same type of valve for one or more of the first precursor outlet line 151, the second precursor outlet line 152, the first inert gas outlet line 155B, the reactive gas outlet line 162, and the second inert gas outlet line 165B. For example, where each of the first precursor outlet line 151 and the second precursor outlet line 152 independently comprise a three-way flow-through valve, the reference numeral 172 is used to denote the three-way flow-through valve of the first precursor outlet line 151, and the three-way flow-through valve of the second precursor outlet line 152.

In some embodiments, one or more of the first precursor outlet line 151, the second precursor outlet line 152, the first inert gas outlet line 155B, the reactive gas outlet line 162, and the second inert gas outlet line 165B independently comprises an orifice. In some embodiments, each of the first precursor outlet line 151, the second precursor outlet line 152, the first inert gas outlet line 155B, the reactive gas outlet line 162, and the second inert gas outlet line 165B independently comprises an orifice.

In one or more embodiments, the first precursor outlet line 151 comprises a first orifice 151A located downstream from the pressure-controlled precursor reservoir 150. In one or more embodiments, the first orifice 151A is located downstream from the pressure-controlled precursor reservoir 150, and the first orifice 151A is located upstream from the three-way flow-through valve 172 of the first precursor outlet line 151.

In one or more embodiments, the second precursor outlet line 152 comprises a second orifice 152A located downstream from the pressure-controlled precursor reservoir 150. In one or more embodiments, the second orifice 152A is located downstream from the pressure-controlled precursor reservoir 150, and the second orifice 152A is located upstream from the three-way flow-through valve 172 of the second precursor outlet line 152.

In one or more embodiments, each of the first orifice 151A and the second orifice 152A independently has a diameter in a range of from 200 μm to 1500 μm. In one or more embodiments, the first orifice 151A and the second orifice 152A have the same diameter in the range of from 200 μm to 1500 μm. In one or more embodiments, where the first flow rate is greater than the second flow rate, the first orifice 151A has a diameter that is larger than the diameter of the second orifice 152A.

In one or more embodiments, the first inert gas outlet line 155B comprises an orifice 155D located downstream from the first inert gas reservoir 155. In one or more embodiments, the orifice 155D is located downstream from the first inert gas reservoir 155, and the orifice 155D is located upstream from the three-way flow-through valve 172 of the first inert gas outlet line 155B. In one or more embodiments, the orifice 155D has a diameter in a range of from 200 μm to 1500 μm.

In one or more embodiments, the reactive gas outlet line 162 comprises an orifice 162A located downstream from the reactive gas reservoir 160. In one or more embodiments, the orifice 162A is located downstream from the reactive gas reservoir 160, and the orifice 162A is located upstream from the three-way flow-through valve 172 of the reactive gas outlet line 162. In one or more embodiments, the orifice 162A has a diameter in a range of from 200 μm to 1500 μm.

In one or more embodiments, the second inert gas outlet line 165B comprises an orifice 165D located downstream from the second inert gas reservoir 165. In one or more embodiments, the orifice 165D is located downstream from the second inert gas reservoir 165, and the orifice 165D is located upstream from the three-way flow-through valve 172 of the second inert gas outlet line 165B. In one or more embodiments, the orifice 165D has a diameter in a range of from 200 μm to 1500 μm.

Instead of co-flowing inert purge gas along with cyclical gaseous precursor pulsing, in one or more embodiments, the precursor delivery system 100 is configured to provide both inert and precursor flow in cyclical mode that are out of sync. In some embodiments, a sequential pulse and purge process cycles inert purge gas out of phase with the precursor cycle. One or more embodiments of the disclosure have very high inert pulse which is more efficient in reducing cycle time. In some embodiments, a dose of precursor is increased to obtain better ALD film properties, like step coverage. Some embodiments advantageously reduce pressure fluctuations in the process chamber.

In one or more embodiments, the arrangement and use of ALD valves enable fast cycle times. In some embodiments, fast cycle times are achieved by adding an additional fast switching valve upstream of the chemical dosing valve. In some embodiments, the upstream purge valve is connected to a pressure reservoir filled with inert or alternate gas. After opening and closing dose valve (dose step), purge valve is opened allowing fast response time of high flow inert gas to purge the chemistry out of the line and downstream volume.

In one or more embodiments, the precursor delivery system 100 includes two separate ampoules for delivering the precursor at a high concentration in a first ampoule and delivering the same precursor at a low concentration in a second ampoule, or vice versa.

Some embodiments provide an arrangement of valves (including additional fast switching valves upstream of dose valve). In some embodiments, adding an inert pressure reservoir enables very fast response time of the high flow inert gas. Some embodiments provide a valve manifold block with minimum trapped volume. Some embodiments provide a valve manifold block with minimum volume between two valves. Some embodiments provide a valve manifold block with high conductance purge feedthrough.

Some embodiments provide apparatus and methods for delivering chemistry changes with response rates less than or equal to 50 milliseconds. Some embodiments provide apparatus and methods with faster response rates than with mass flow controllers (MFC). Some embodiments provide apparatus and methods for delivering chemistry without a high flow constant purge that dilutes the chemistry.

Referring still to FIG. 1, the precursor delivery system 100 comprises a plurality of purge gas lines. The plurality of purge gas lines can include any suitable number of purge gas lines. In one or more embodiments, the plurality of purge gas lines comprises a first purge gas line (denoted by "Precursor Purge #1") and a second purge gas line (denoted by "Precursor Purge #2"). The first purge gas line (Precursor Purge #1) is configured to provide a continuous flow of a purge gas. In one or more embodiments, the first purge gas line (Precursor Purge #1) is configured to provide a continuous flow of argon (Ar). The second purge gas line (Precursor Purge #2) is configured to provide a continuous flow of a purge gas. In one or more embodiments, the second purge gas line (Precursor Purge #2) is configured to provide a continuous flow of argon (Ar). In one or more embodiments, the plurality of purge gas lines further comprises one or more additional purge gas lines (denoted by "Purge" in FIG. 1).

In the chemical delivery system 101, each of the plurality of purge gas lines independently comprises a source, a mass flow controller (MFC), and a valve 170. In one or more embodiments, the valve 170 can be any suitable valve configured for controlling the distribution of the purge gas from the source, through the plurality of purge gas lines, to the processing chamber 300. The valve 170 can be the same as the inlet valve 130. In one or more embodiments, the valve 170 is a slow acting pneumatic valve.

The processing chamber 300 can be any suitable processing chamber. In one or more embodiments, the processing chamber 300 is an atomic layer deposition (ALD) chamber. It will be understood and appreciated by the skilled artisan that the schematic representation of the processing chamber 300 shown in FIG. 1 is not limited to the configuration illustrated, and that one or more additional components can be included in the processing chamber 300 without undue experimentation.

The processing chamber 300 can be part of a single chamber processing system or multi-chamber processing system, such as a clustered-tool configuration without an intervening vacuum break. The single chamber processing system or multi-chamber processing system can include any suitable processing chamber used for the fabrication of a semiconductor device, without limitation, that comprises a film deposited on a substrate (i.e., substrate 302), such as metal film 500.

The processing chamber 300 comprises a chamber body 301 having a top wall 305, a bottom wall 307, and two opposed sidewalls 308 containing an interior volume 309. The top wall 305 of the chamber body 301 is defined by a bottom surface of the gas distribution system 200. The gas distribution system 200 can be any suitable gas distribution system. In one or more embodiments, the gas distribution system 200 is a showerhead assembly. In one or more embodiments, the precursor delivery system 100 is configured to deliver the precursor, first inert gas, reactive gas, second inert gas, and purge gas (collectively, the process gasses) through the gas distribution system 200, and into the processing chamber 300.

The processing chamber 300 includes a substrate support pedestal 310, a substrate support surface 303, and a substrate 302 on the substrate support surface 303. The substrate 302 is entirely within the interior volume 309. The substrate 302 may be processed within the interior volume 309, then transferred out of the processing chamber 300 through a slit valve 306 for further processing. The slit valve 306 can open and close to isolate the interior volume 309 from the external processing chamber environment. In FIG. 1, the slit valve 306 is shown in the closed position, denoted by the presence of a slit cover 306A.

The processing chamber 300 comprises a pressure gauge 140. The pressure gauge 140 of the processing chamber 300 can be the same as the pressure gauge 140 used in the precursor delivery system. The processing chamber 300 can be maintained at any suitable pressure, and the pressure can vary depending on the particular application. In some embodiments, the processing chamber 300 is maintained at a pressure in a range of from 1 Torr to 900 Torr.

In one or more embodiments, the processing chamber 300 includes at least one valve 180 connected thereto. The valve 180 can be any suitable valve described herein. In one or more embodiments, the valve 180 is a slow acting pneumatic valve.

The throttle valve (TV) is configured to control the pressure of the processing chamber 300. During wafer processing, the throttle valve (TV) is configured to maintain the processing chamber 300 at a pressure in a range of from 1 Torr to 900 Torr. During wafer transfer, e.g., through the slit valve 306, the TV is configured to pump down the processing chamber 300 to a pressure less than or equal to 1 Torr.

In one or more embodiments, as shown in FIG. 1, the processing chamber 300 includes a turbo pump connected thereto. The skilled artisan will appreciate that while the turbo pump is shown in FIG. 1, the disclosure is not limited to a turbo pump, and other low pressure pumps such as a cryo-pump or diffusion pump can be used.

Referring still to FIG. 1, "SUB FAB," as used herein, refers to an area below the processing chamber 300. Without limitation, SUB FAB includes one or more components in the area below the processing chamber 300 and the one or more components are used to control one or more aspects of and/or processes performed in the processing chamber 300. In FIG. 1, "Ch Pump," as used herein, refers to a chamber pump that is positioned in the area below the processing chamber 300. Accordingly, in one or more embodiments, Ch Pump is included in the SUB FAB.

In one or more embodiments, the processing chamber 300 comprises a controller configured to deposit a film on the substrate 302 in the processing chamber 300. In one or more embodiments, the controller has one or more of: a configuration to control a flow of the precursor; a configuration to control a flow of the first inert gas; a configuration to control a flow of the reactive gas; a configuration to control a flow of the second inert gas; a configuration to control the pressure of the pressure-controlled precursor reservoir 150; or a configuration to control the pressure of the processing chamber 300.

Additional embodiments are directed to a processing method comprising: exposing a substrate (i.e., substrate 302) in a processing chamber (i.e., processing chamber 300) to a metal precursor and a reactive gas to deposit a metal film 500 on the substrate 304, wherein the precursor and the reactive gas are each independently delivered to the substrate 302 from the precursor delivery system 100 described herein. In one or more embodiments, the metallic precursor comprises a metal halide precursor. In one or more embodiments, the metallic precursor comprises molybdenum pentachloride ($MoCl_5$). In one or more embodiments, the metallic precursor comprises tungsten hexachloride ($WCl_6$). In one or more embodiments, the metallic precursor is molybdenum pentachloride ($MoCl_5$) and the reactive gas is hydrogen ($H_2$) to deposit a metal film 500 comprising, consisting essentially of, or consisting of molybdenum (Mo). In one or more embodiments, the metallic precursor is tungsten hexachloride ($WCl_6$) and the reactive gas is hydrogen ($H_2$) to deposit a metal film 500 comprising, consisting essentially of, or consisting of tungsten (W).

Figure 2A:
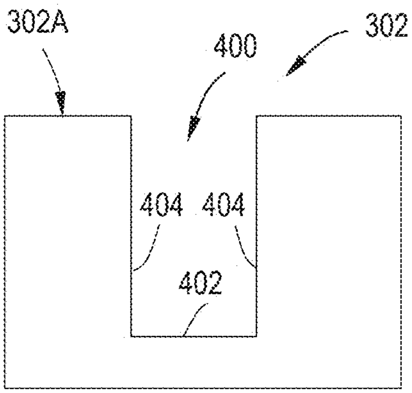
FIG. 2A illustrates a cross-sectional view of a substrate according to one or more embodiments of the present disclosure.
Figure 2B:
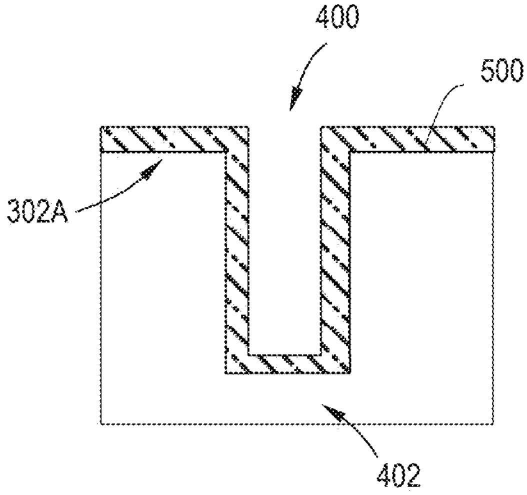
FIG. 2B illustrates a cross-sectional view of a substrate according to one or more embodiments of the present disclosure.
Figure 2C:
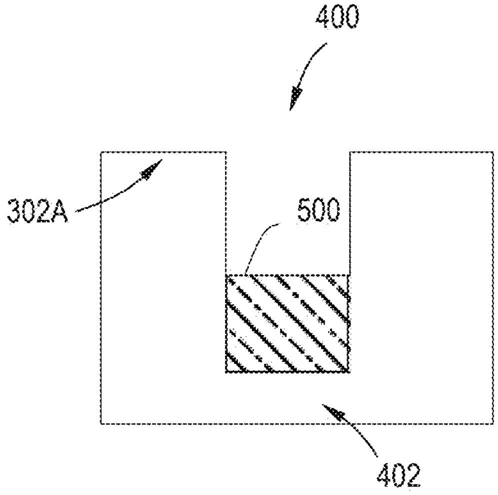
FIG. 2C illustrates a cross-sectional view of a substrate according to one or more embodiments of the present disclosure.

FIG. 2A-2C illustrate cross-sectional views of the substrate 302 according to one or more embodiments. The substrate 302 can be any suitable substrate material. In one or more embodiments, the substrate 302 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the substrate 302 comprises one or more of silicon (Si), silicon oxide (SiOx), germanium (Ge), gallium (Ga), arsenic (As), indium (In), phosphorus (P), or selenium (Se). In one or more embodiments, the substrate 302 comprises one or more of silicon (Si) or silicon oxide (SiOx). In one or more embodiments, the substrate 302 comprises at least one metallic material and at least one dielectric material.

Although a few examples of materials from which the substrate 302 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In FIG. 2A-2C, the substrate 302 comprises at least one feature 400. FIG. 2A-2C illustrate the substrate 302 having one feature 400 for illustrative purposes, and the skilled artisan will appreciate that the substrate 302 can include any number of features. In one or more embodiments, the at least one feature 400 comprises a top surface 302A, two sidewalls 404 comprising, for example, a dielectric material, and a bottom 402 extending into the substrate 302, the bottom 402 comprising, for example, a metallic material.

FIG. 2B illustrates the metal film 500 conformally deposited on the top surface 302A and along the two sidewalls 404 and bottom 402.

FIG. 2C illustrates the metal film 500 selectively deposited on the bottom 402 based on the etching regime and deposition regime that is advantageously provided by the precursor delivery system 100.

In use, flow profile modulation and control can enable deposition selectivity improvement by enabling etch and deposition within each precursor pulse. In one or more embodiments, the first precursor outlet line 151 is configured to deliver the precursor at a first flow rate and the second precursor outlet line 152 is configured to deliver the precursor at a second flow rate. In one or more embodiments, the first flow rate and the second flow rate are different.

In one or more embodiments, the first flow rate is greater than the second flow rate. In specific embodiments where the first flow rate is greater than the second flow rate, the precursor (e.g., a metal halide precursor including tungsten hexachloride ($WCl_6$) or molybdenum pentachloride ($MoCl_5$)) is delivered at a high concentration, i.e., the first flow rate, thereby providing an etching regime, and the precursor (e.g., a metal halide precursor including tungsten hexachloride ($WCl_6$) or molybdenum pentachloride ($MoCl_5$)) is delivered at a low concentration, i.e., the second flow rate thereby providing a deposition regime.

It has been advantageously found that where the first flow rate is greater than the second flow rate, the precursor (e.g., a metal halide precursor including tungsten hexachloride ($WCl_6$) or molybdenum pentachloride ($MoCl_5$)) is delivered at a high concentration, i.e., the first flow rate, thereby providing an etching regime, and the precursor (e.g., a metal halide precursor including tungsten hexachloride ($WCl_6$) or molybdenum pentachloride ($MoCl_5$)) is delivered at a low concentration, i.e., the second flow rate thereby providing a deposition regime, produces improved deposition selectivity.

The precursor delivery system 100 can be used in any suitable processing system. The processing system can include any suitable processing chamber(s) used for the fabrication of a semiconductor device, without limitation, that comprises a film deposited on a substrate, such as the metal film 500. The particular arrangement of processing chambers and components can be varied depending on the processing system and should not be taken as limiting the scope of the disclosure.

Processes may generally be stored in the memory of a system controller as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium including instructions that, when executed by a controller of a processing system, causes the processing system to perform the operations of any of the methods described herein.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A precursor delivery system comprising:

an ampoule configured to contain a precursor;

a pressure-controlled precursor reservoir including a precursor inlet line connected to the ampoule and a plurality of outlet lines connected to the pressure-controlled precursor reservoir;

a first inert gas reservoir including a first inert gas inlet line connected to a first inert gas source and a first inert gas outlet line connected to the first inert gas reservoir;

a reactive gas reservoir including a reactive gas inlet line connected to a reactive gas source and a reactive gas outlet line connected to the reactive gas reservoir, the reactive gas inlet line configured to allow a reactive gas to be delivered from the reactive gas source to the reactive gas reservoir; and a second inert gas reservoir including a second inert gas inlet line connected to a second inert gas source and a second inert gas outlet line connected to the second inert gas reservoir, the plurality of outlet lines including a first precursor outlet line and a second precursor outlet line, each of the first precursor outlet line and the second precursor outlet line configured to allow the precursor to be delivered from the pressure-controlled precursor reservoir to a processing chamber, wherein the first precursor outlet line is configured to deliver the precursor at a first flow rate and the second precursor outlet line is configured to deliver the precursor at a second flow rate.

2. The precursor delivery system of claim 1, wherein the precursor inlet line is configured to allow the precursor to be delivered from the ampoule to the pressure-controlled precursor reservoir.

3. The precursor delivery system of claim 1, wherein the first inert gas inlet line is configured to allow a first inert gas to be delivered from the first inert gas source to the first inert gas reservoir.

4. The precursor delivery system of claim 3, wherein the first inert gas outlet line is configured to allow the first inert gas to be delivered from the first inert gas reservoir to the processing chamber.

5. The precursor delivery system of claim 1, wherein the reactive gas outlet line is configured to allow the reactive gas to be delivered from the reactive gas reservoir to the processing chamber.

6. The precursor delivery system of claim 1, wherein the second inert gas inlet line is configured to allow a second inert gas to be delivered from the second inert gas source to the second inert gas reservoir.

7. The precursor delivery system of claim 6, wherein the second inert gas outlet line is configured to allow the second inert gas to be delivered from the second inert gas reservoir to the processing chamber.

8. The precursor delivery system of claim 1, wherein each of the precursor inlet line, the first inert gas inlet line, the reactive gas inlet line, and the second inert gas inlet line independently comprises an inlet valve.

9. The precursor delivery system of claim 8, wherein each inlet valve is a fast switching valve configured to open and close within 50 milliseconds.

10. The precursor delivery system of claim 1, wherein the first precursor outlet line comprises a first orifice located downstream from the pressure-controlled precursor reservoir, and the second precursor outlet line comprises a second orifice located downstream from the pressure-controlled precursor reservoir.

11. The precursor delivery system of claim 10, wherein each of the first orifice and the second orifice independently has a diameter in a range of from 200 μm to 1500 μm.

12. The precursor delivery system of claim 1, wherein the first flow rate is greater than the second flow rate.

13. The precursor delivery system of claim 1, wherein the first inert gas outlet line comprises an orifice located downstream from the first inert gas reservoir.

14. The precursor delivery system of claim 1, wherein the reactive gas outlet line comprises an orifice located downstream from the reactive gas reservoir.

15. The precursor delivery system of claim 1, wherein the second inert gas outlet line comprises an orifice located downstream from the second inert gas reservoir.

16. The precursor delivery system of claim 1, wherein the pressure-controlled precursor reservoir is maintained at a pressure in a range of from 50 Torr to 900 Torr.

17. The precursor delivery system of claim 1, wherein the precursor is molybdenum pentachloride ($MoCl_5$).

18. The precursor delivery system of claim 1, wherein the reactive gas comprises hydrogen ($H_2$).

19. The precursor delivery system of claim 1, further comprising a controller having one or more of: a configuration to control a flow of the precursor; a configuration to control a flow of the first inert gas; a configuration to control a flow of the reactive gas; a configuration to control a flow of the second inert gas; a configuration to control a pressure of the pressure-controlled precursor reservoir; or a configuration to control a pressure of the processing chamber.

* * * * *